(12) United States Patent
Schwarzenbacher et al.

(10) Patent No.: US 9,698,029 B2
(45) Date of Patent: Jul. 4, 2017

(54) METHOD AND APPARATUS FOR PROCESSING WAFER-SHAPED ARTICLES (71) Applicant: LAM RESEARCH AG, Villach (AT)

(72) Inventors: Reinhold Schwarzenbacher, Reisseck (AT); Christian Putzi, Rosenbach (AT)

(73) Assignee: LAM RESEARCH AG, Villach (AT)

( * ) Notice: Subject to any disclaimer, the term of this patent is extended or adjusted under 35 U.S.C. 154(b) by 0 days.

(21) Appl. No.: 14/184,304

(22) Filed: Feb. 19, 2014

(65) Prior Publication Data
US 2015/0235876 A1 Aug. 20, 2015

(51) Int. Cl.
*H01L 21/67* (2006.01)
(52) U.S. Cl.
CPC .................. *H01L 21/6715* (2013.01)
(58) Field of Classification Search
CPC ................................... H01L 21/6715
See application file for complete search history.

(56) References Cited

U.S. PATENT DOCUMENTS

| | | | |
|---|---|---|---|
| 4,176,003 A * | 11/1979 | Brower | H01L 21/32105 148/DIG. 143 |
| 4,903,717 A | 2/1990 | Sumnitsch | |
| 5,513,668 A | 5/1996 | Sumnitsch | |
| 7,837,803 B2 | 11/2010 | Hohenwarter | |
| 2007/0175500 A1* | 8/2007 | Hohenwarter | H01L 21/67051 134/149 |
| 2010/0186672 A1* | 7/2010 | Okuda | C23C 16/4586 118/723 R |
| 2011/0163452 A1* | 7/2011 | Horii | C23C 16/06 257/758 |
| 2015/0314338 A1* | 11/2015 | Morioka | H01L 21/67017 134/98.1 |

* cited by examiner

*Primary Examiner* — Michael Barr
*Assistant Examiner* — Spencer Bell (57) ABSTRACT

A method and device for processing wafer-shaped articles includes a spin chuck for holding and rotating a wafer-shaped article about a rotation axis, and at least one dispenser for dispensing a fluid onto at least one surface of a wafer-shaped article. A collector surrounds the spin chuck for collecting process fluids, with at least two collector levels for separately collecting fluids in different collector levels. Each collector level comprises an exhaust gas collecting chamber leading to a respective exhaust gas conduit. At least one of the exhaust gas conduits comprises a valve mechanism that reciprocally restricts exhaust gas flow from its associated exhaust gas conduit while opening the exhaust gas conduit to an ambient environment outside the collector, and vice-versa.

13 Claims, 7 Drawing Sheets

METHOD AND APPARATUS FOR PROCESSING WAFER-SHAPED ARTICLES

BACKGROUND OF THE INVENTION

1. Field of the Invention

The invention relates to a device and a method for processing wafer-shaped articles, such as semiconductor wafers, flat panel displays or optical discs.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

U.S. Pat. No. 4,903,717 discloses that its spin-chuck may be raised and lowered relative to a surrounding liquid collector that has plural liquid collecting levels and a common exhaust for collecting gas from the interior of the liquid collector.

U.S. Pat. No. 7,837,803 discloses an improved liquid and gas collector in which the exhaust at each of the levels may be individually controlled via valves provided at each of the levels. However, depending upon the particular process being performed upon the wafer-shaped article, the valves of that patent will come in contact with chemically aggressive fumes. It can be difficult to maintain such valves in good working order under such conditions.

There is therefore a need for a collector structure that can better prevent fumes from various media (e.g., acid, base, organic) from intermingling in a common process chamber, so as to prevent vapor cross-contamination. Such cross-contamination could result in the deposition of crystalline solids on delicate processing equipment, as well as various safety issues.

SUMMARY OF THE INVENTION

The invention in one aspect thus pertains to a device for processing wafer-shaped articles, comprising a spin chuck for holding and rotating a wafer-shaped article about a rotation axis, and at least one dispenser for dispensing a fluid onto at least one surface of a wafer-shaped article. A collector surrounds the spin chuck for collecting process fluids, with at least two collector levels for separately collecting fluids in different collector levels. Each of the at least two collector levels comprises an exhaust gas collecting chamber leading to a respective exhaust gas conduit. At least one of the exhaust gas conduits comprises a valve mechanism that reciprocally restricts exhaust gas flow from its associated exhaust gas conduit while opening the exhaust gas conduit to an ambient environment outside the collector, and vice-versa. The term "fluid" as used herein is intended to connote a liquid, however such liquid may contain gas bubbles (for example as a two-phase mixture in the nature of a foam), or may be a mixture of two or more miscible or immiscible liquids, or a liquid including suspended solids, or any mixtures of the foregoing.

In preferred embodiments of the device according to the present invention, one of the exhaust conduits comprises a bypass valve operable to route exhaust gas from the one of the exhaust conduits to another of the exhaust conduits.

In preferred embodiments of the device according to the present invention, the valve mechanism comprises a flap valve movable between a chamber position in which exhaust gas from its associated exhaust conduit is permitted to pass while the exhaust conduit is sealed to the exterior ambient, and an ambient position in which ambient atmosphere outside the collector is permitted to pass while the exhaust conduit is sealed to chamber exhaust gases upstream of the valve mechanism.

In preferred embodiments of the device according to the present invention, the collector comprises at least three of the collector levels, and wherein exhaust conduits of at least two of the collector levels each comprise a corresponding valve mechanism.

In preferred embodiments of the device according to the present invention, one of the exhaust conduits comprises a first bypass valve operable to route exhaust gas from one of the exhaust conduits to a second of the exhaust conduits, and a second bypass valve operable to route exhaust gas from one of the exhaust conduits to a third of the exhaust conduits.

In preferred embodiments of the device according to the present invention, a controller is provided for actuating the valve mechanism, and the valve mechanism is actuated in response to the spin chuck being moved relative to the collector from one collector level to another collector level.

In preferred embodiments of the device according to the present invention, the collector levels are vertically superposed along an axis of rotation of the spin chuck.

In preferred embodiments of the device according to the present invention, the collector comprises three collector levels, and an exhaust conduit of an uppermost one of the three collector levels comprises a first bypass valve that is operable to divert exhaust gas from the exhaust conduit to an exhaust conduit of a lowermost one of the three collector levels, a second bypass valve that is operable to divert exhaust gas from the exhaust conduit to an exhaust conduit of a middle one of the three collector levels, and a valve mechanism disposed in the exhaust conduit of the uppermost collector level downstream of the first and second bypass valves.

In preferred embodiments of the device according to the present invention, the collector comprises three collector levels, and each corresponding exhaust conduit comprises a respective valve mechanism.

In preferred embodiments of the device according to the present invention, the valve mechanism is operable such that actuation of the valve mechanism in its associated exhaust conduit causes a pressure variation of less than 20 Pa in any others of the at least two collector levels.

In preferred embodiments of the device according to the present invention, the collector comprises three collector levels, and each corresponding exhaust conduit comprises a respective valve mechanism.

In preferred embodiments of the device according to the present invention, at least one of the exhaust gas conduits further comprises a bypass valve disposed upstream of the valve mechanism, the bypass valve being operable to route exhaust gas from that exhaust conduit to another of the exhaust conduits.

In preferred embodiments of the device according to the present invention, the valve mechanism and the bypass valve are operated by a controller such that the bypass valve is actuated to divert exhaust gas from the at least one conduit to another conduit simultaneously with actuation of the valve mechanism to seal the at least one exhaust conduit against passage of chamber exhaust while opening the at least one gas conduit to an exterior ambient at a location downstream of the bypass valve.

In another aspect, the present invention relates to a method for processing wafer-shaped articles, comprising holding and rotating a wafer-shaped article about a rotation axis on a spin chuck, and dispensing a first fluid onto at least one surface of the wafer-shaped article. Process fluids are separately collected in at least two process levels of a collector that surrounds the spin chuck. Each of the at least two collector levels comprises an exhaust gas collecting chamber leading to a respective exhaust gas conduit. A valve mechanism associated with at least one of the exhaust gas conduits is operated so as reciprocally to restrict exhaust gas flow from its associated exhaust gas conduit while opening that exhaust gas conduit to an ambient environment outside the collector, and vice-versa.

In preferred embodiments of the method according to the present invention, a bypass valve mounted in one of the exhaust conduits is operated so as to route exhaust gas from that exhaust conduit to another exhaust conduit.

In preferred embodiments of the method according to the present invention, the valve mechanism is operated so as to move a flap valve between a chamber position in which exhaust gas from its associated exhaust conduit is permitted to pass while the exhaust conduit is sealed to the exterior ambient, and an ambient position in which ambient atmosphere outside the collector is permitted to pass while the exhaust conduit is sealed to chamber exhaust gases upstream of the valve mechanism.

In preferred embodiments of the method according to the present invention, the valve mechanism is operated such that actuation of the valve mechanism in its associated exhaust conduit causes a pressure variation of less than 20 Pa in any others of the at least two collector levels.

In preferred embodiments of the method according to the present invention, process gases having respectively different compositions are exhausted each through a respective exhaust conduit.

In preferred embodiments of the method according to the present invention, a second fluid is dispensed onto the wafer, wherein the chemical composition of the second fluid differs from that of the first fluid, and collecting gas generated from the second process fluid through a different exhaust conduit than that through which gas generated by the first process fluid is collected.

In preferred embodiments of the method according to the present invention, exhaust gases are collected simultaneously from at least two separate collectors, by a common exhaust unit.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION

In the embodiments described hereinafter, the exhaust gas flow is controlled so that minimum influence occurs when specific exhausts corresponding to specific process levels are switched on or off. If an exhaust of a process level is closed this would create a reduced pressure in that specific exhaust. For avoiding this (pressure drop) the exhaust is closed to the process level and simultaneously opened to the ambient air. Consequently the same amount of air is exhausted and there will not occur any sudden pressure reduction. This technique thus also prevents cross contamination in the chamber if the pressure were to suddenly increase.

Figure 1:
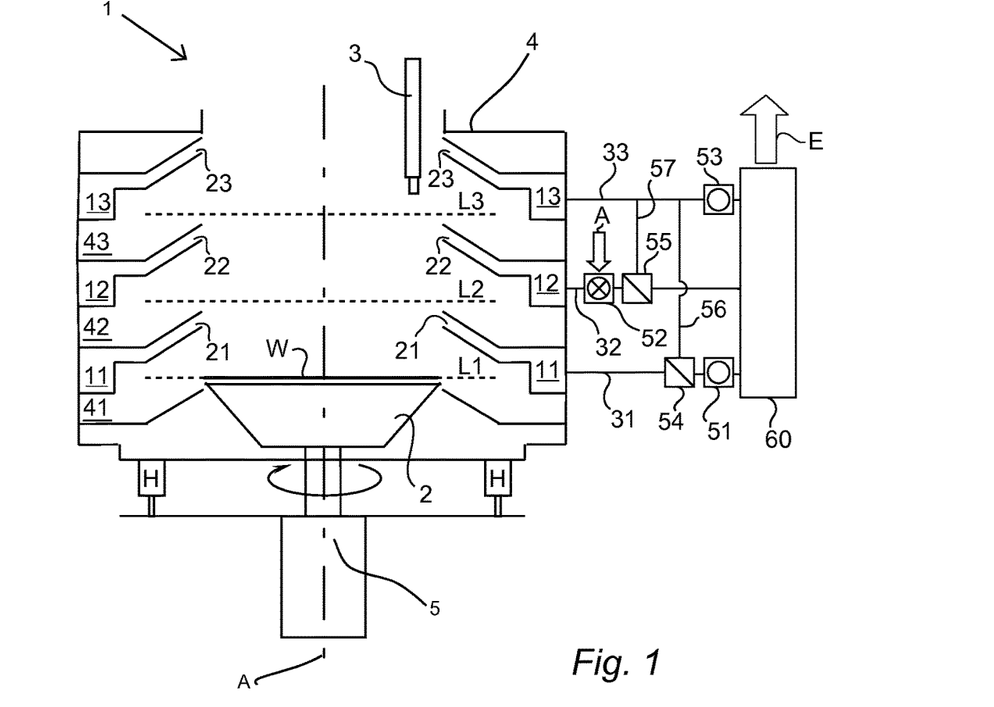
FIG. 1 shows a schematic side view of a device according to a first embodiment of the present invention.

FIG. 1 shows a device 1 comprising a spin chuck 2 for holding and rotating a wafer W. The spin chuck 2 is connected to a gear motor unit 5 to be rotated about its axis A. A dispensing device 3 is used for dispensing fluid onto the upper surface of the substrate W. Wafer W may for example be a 300 mm or 450 mm silicon wafer undergoing any of various front-end-of-line (FEOL), middle-of-line, (MOL), or back-end-of-line (BEOL) processes, including associated cleaning and drying processes.

A cup-like fluid collector 4 circumferentially surrounds the spin chuck 2. The fluid collector is preferably mounted on a frame (not shown). Lifting devices H, such as hydraulic jacks or pneumatic cylinders, are provided to alter the spin chuck position relative to the fluid collector, in this case by raising the fluid collector 4. The spin chuck 2 can thus be positioned at each of the three collector levels L1, L2 and L3.

Each collector level L1, L2, L3 comprises an annular duct 41, 42, 43 that collects spun-off process fluid. An additional splash guard (not shown) can be used for each collector level to allow spun-off fluid to hit it at an acute angle and thereafter to be directed to the annular duct. Each annular duct 41, 42, 43 is connected to a respective pipe (not shown) through which the collected fluid is drained. Drained fluid can be reused to be dispensed to the substrate, or collected as waste fluid.

The dashed lines in FIG. 1 indicate the relative positions where the substrate is to be placed for spinning off the fluids into the different collector levels.

Above each collector level L1, L2, L3 an interiorly open annular exhaust duct 21, 22, 23 is arranged. Each duct 21, 22, 23 leads to a respective annular gas-collecting chamber 11, 12, 13.

Each gas-collecting chamber 11, 12, 13 is connected by a respective exhaust pipe 31, 32, 33 to an exhaust unit 60, which comprises a fan or the like to draw exhaust gases from the collector and discharge those gases as depicted by the arrow E. Only one exhaust unit 60 is shown in Each exhaust pipe 31, 32, 33 in this embodiment is equipped with a respective valve 51, 52, 53 that can be controlled so as to pass the exhaust gas from its associated collector level, or, alternatively, to close off the exhaust from its associated collector level while opening the valve 51, 52, 53 to the ambient atmosphere outside the collector 4.

Also in this embodiment, a bypass valve 54 is positioned in communication with exhaust pipes 31 and 33, so that the exhaust from level L3 of the collector may if desired be re-routed from the exhaust pipe 33 to the exhaust pipe 31, or vice-versa, via a bypass conduit 56. Similarly, in this embodiment, a bypass valve 55 is positioned in communication with exhaust pipes 32 and 33, so that the exhaust from level L3 of the collector may if desired be re-routed from the exhaust pipe 33 to the exhaust pipe 32, or vice versa, via a bypass conduit 57.

In FIG. 1, the chuck 2 is positioned at level L1, where a given process is performed on the wafer W, for example an SC-1 cleaning process that utilizes an aqueous mixture of ammonium hydroxide and hydrogen peroxide. The gases generated during such a process, which are basic in character, are withdrawn from the chamber 11 via exhaust pipe 31, because bypass valve 54 is in the level 1 position and valve 51 is in the chamber position.

On the other hand, valve 52 is in the ambient position, so that the gas drawn through exhaust pipe 32 is not from the chamber 12 but rather is ambient air, as indicated by the arrow A in FIG. 1. Bypass valve 55 is in the level 2 position, so that the ambient air passes through exhaust pipe 32 and into the exhaust unit 60. As to the level 3 exhaust, this passes through exhaust pipe 33 into the exhaust unit 60, because valve 53 is in the chamber position and bypass valves 54 and 55 are both closed, so that there is no transfer of exhaust among the pipes 31, 32, 33.

Figure 2:
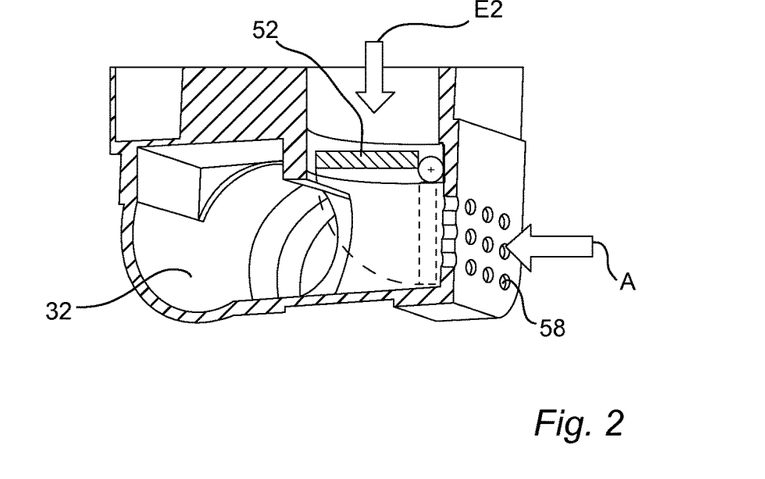
FIG. 2 shows a preferred structural configuration for one of the flap valves 52 shown in FIG. 1.

As shown in FIG. 2, the valve 52 in this embodiment is configured as a flap that moves between the solid line position, in which ambient air is admitted into exhaust pipe 32 through holes 58 (the "ambient position") and the broken line position in which the holes 58 are blocked and exhaust gas E2 from the L2 level of collector 4 is free to enter the exhaust pipe 32 (the "chamber position"). Significantly, a valve 52 as thus described can also be positioned at any desired intermediate position, such that a controlled mixture of ambient and chamber gas is fed to the exhaust pipe.

Although valve 52 is illustrated in FIG. 2, it will be appreciated that valves 51 and 53 are similarly constructed and operate on the same principle.

In the following table, a series of processing operations are set forth in terms of the corresponding positions of valves 51-55, and these will be described in connection with FIGS. 3-14.

illustrates a possible configuration of exhaust pipes 31, 32, 33 and valves 51-54. It will be appreciated from FIG. 9 that the exhaust pipes 31, 32, 33 can be laid out and the bypass valves 54, 55 positioned such that there is no need of additional bypass pipes 56, 57 such as those indicated schematically in FIG. 1.

Figure 3:
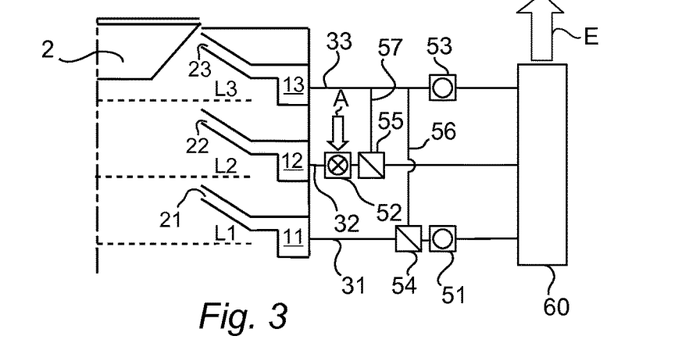
FIG. 3 shows a combination of valve states for a first wafer process.
Figure 4:
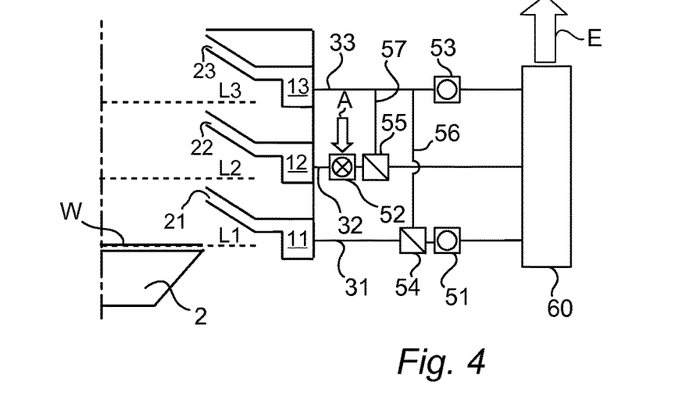
FIG. 4 shows a combination of valve states for a second wafer process.

In FIG. 4, the chuck 2 has been lowered relative to the collector 4 such that the wafer W is at the process level L1. The state of valves 51-55 is unchanged from FIG. 3, and thus remains as shown also in FIGS. 1 and 9.

Figure 5:
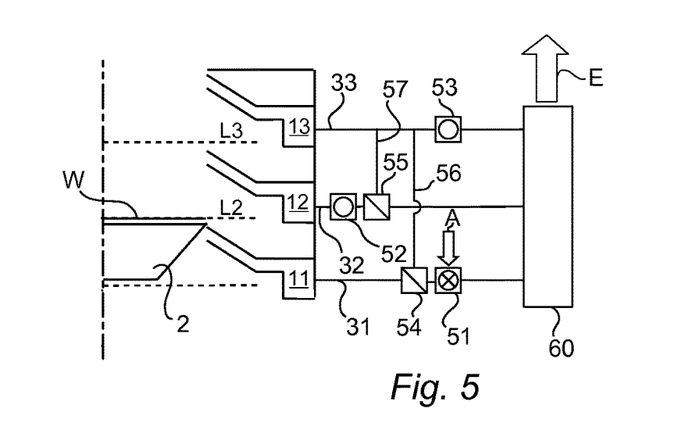
FIG. 5 shows a combination of valve states for a third wafer process.
Figure 10:
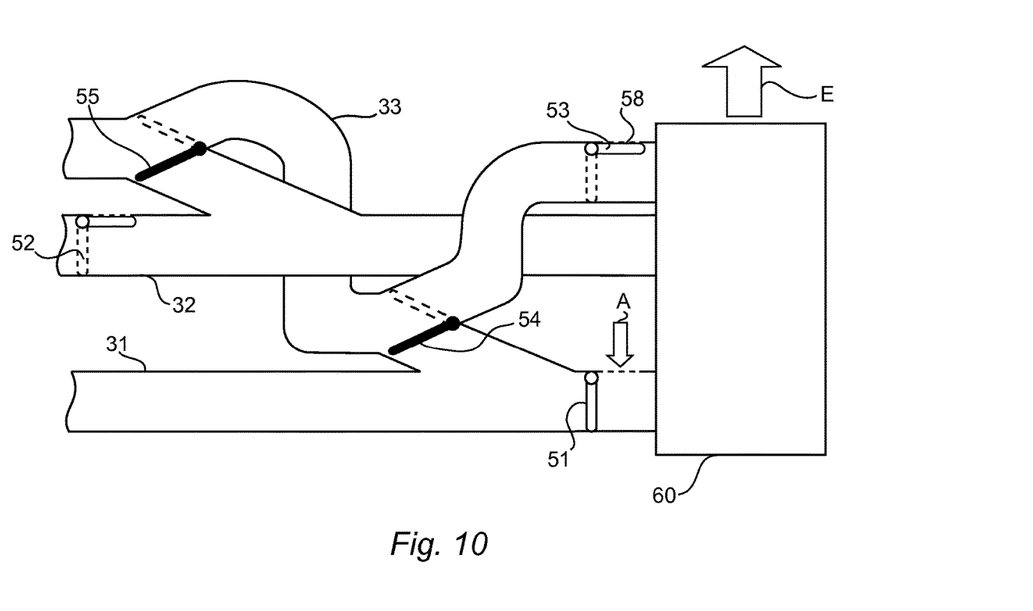
FIG. 10 shows in greater detail the valve states of FIG. 5.

In FIG. 5, the chuck 2 has been raised relative to the collector 4 such that the wafer W is at the process level L2. The level 2 processing in this embodiment involves etching the wafer with a dilute solution of hydrofluoric acid (DHF). As to the state of valves 51-55, it will be appreciated that, in moving from the level 1 processing of FIG. 4 to the level 2 processing of FIG. 5, valve 51 has been switched from its chamber position to its ambient position, whereas valve 52 has been switched from its ambient position to its chamber position. FIG. 10 is a corresponding view that shows the valves and exhaust pipes more fully, and without additional bypass pipes.

In particular, electromechanical actuators under the control of the microprocessor that controls the overall operation of the apparatus, cause the valves 51, 52 to change their respective positions simultaneously and at substantially the same speed. Consequently, any pressure fluctuation within the collector 4 is greatly suppressed. Gases generated by the level 2 processing, which tend to be acidic in character, are exhausted through the pipe 32.

In FIG. 6, the chuck 2 has again been raised relative to the collector 4 such that the wafer W is at the process level L3. The level 3 processing in FIG. 6 of this embodiment involves reduction of airborne molecular contamination (AMC), in which it is desirable to direct the exhaust to the exhaust pipe 31 that is designated for handling exhaust gases of a basic character.

Figure 6:
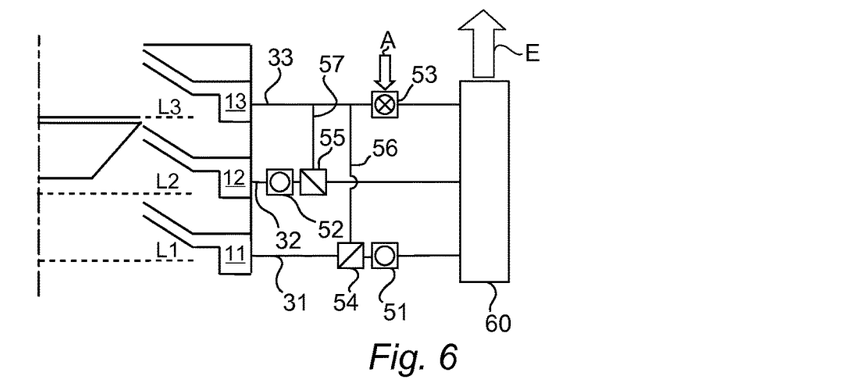
FIG. 6 shows a combination of valve states for a fourth wafer process.
Figure 11:
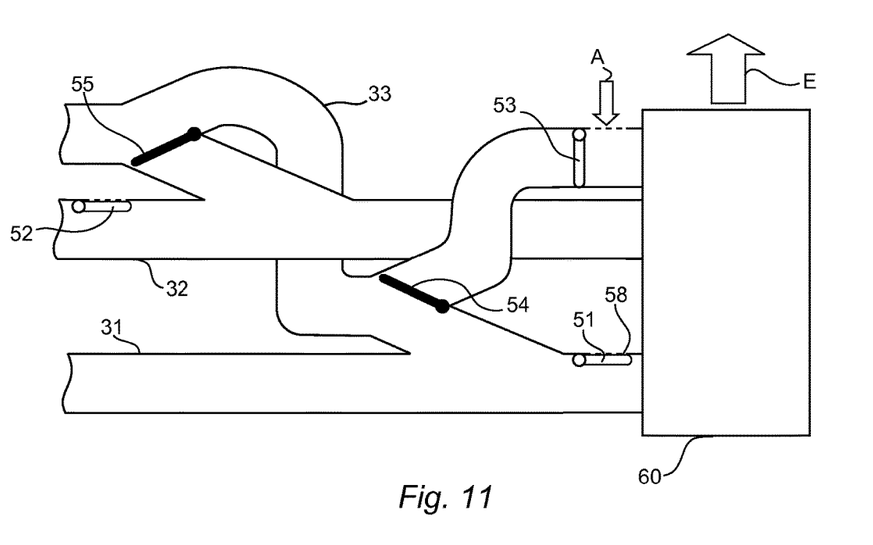
FIG. 11 shows in greater detail the valve states of FIG. 6.

As to the state of valves 51-55, it will be appreciated that, in moving from the level 2 processing of FIG. 5 to the level 3 processing of FIG. 6, valve 51 has been switched from its ambient position to its chamber position, whereas valve 53 has been switched from its chamber position to its ambient position. Additionally, bypass valve 54 has been switched to its level 1 position, such that exhaust gas withdrawn from the chamber 13 of collector 4 will be diverted from exhaust pipe 33 to the exhaust pipe 31. FIG. 11 is a corresponding view that shows the valves and exhaust pipes more fully, and without additional bypass pipes.

In moving from the level 2 processing of FIGS. 5 and 10 to the level 3 processing of FIGS. 6 and 11, the valves 51, 53, 55 are again actuated simultaneously and in synchroni-

| Exhaust valve | Load/Unload | Level 1 processing | Level 2 processing | Level 3 processing (exhaust to Level 1) | Level 3 processing (exhaust to Level 2) | Level 3 (processing exhaust to Level 3) |
|---|---|---|---|---|---|---|
| Valve 51 | Chamber | Chamber | Ambient | Chamber | Chamber | Chamber |
| Valve 52 | Ambient | Ambient | Chamber | Chamber | Ambient | Ambient |
| Valve 53 | Chamber | Chamber | Chamber | Ambient | Chamber | Chamber |
| Valve 54 | Level 3 | Level 3 | Level 3 | Level 1 | Level 3 | Level 3 |
| Valve 55 | Level 3 | Level 3 | Level 3 | Level 3 | Level 2 | Level 3 |

Figure 9:
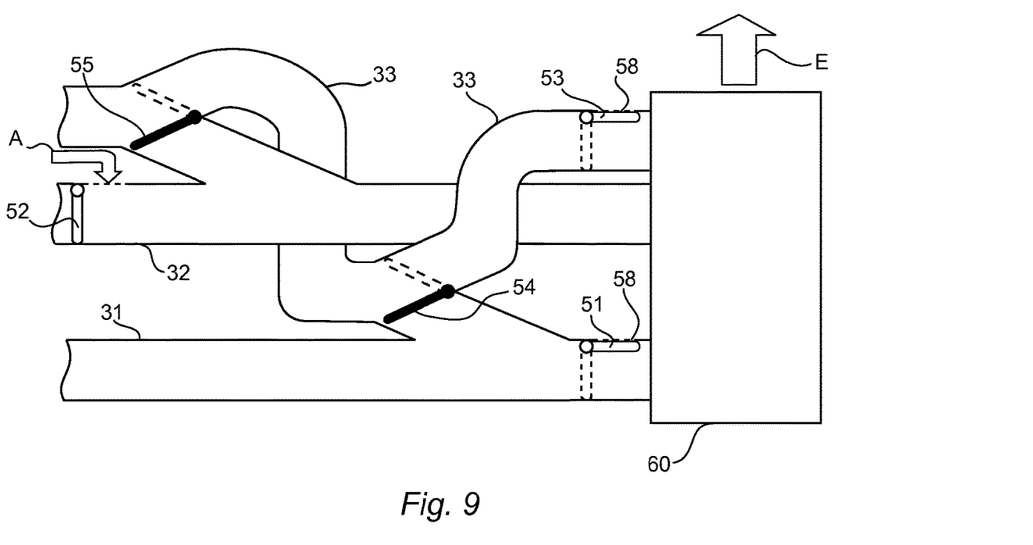
FIG. 9 shows in greater detail the valve states of FIGS. 3, 4 and 8.
Figures 13, 14:
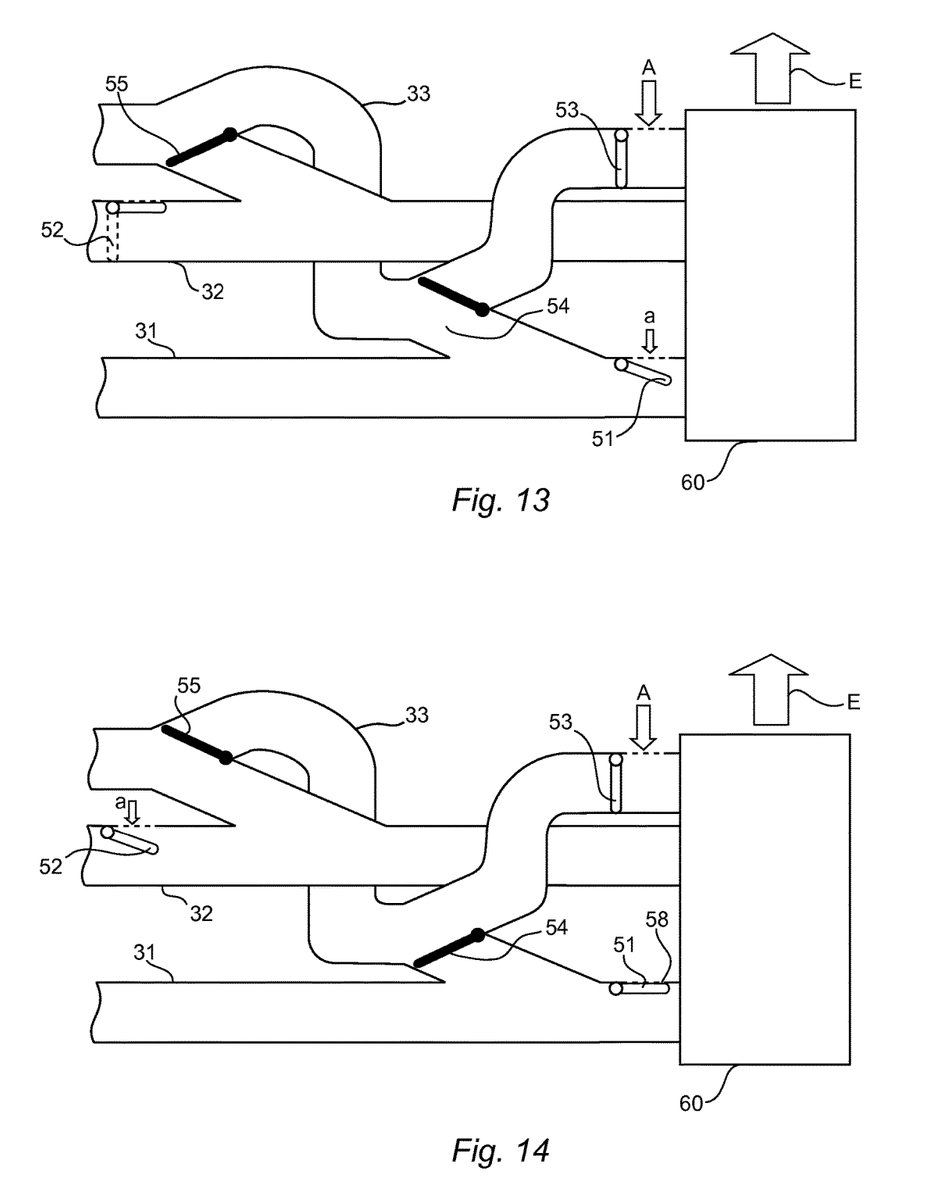
FIG. 13 shows a variation of the valve states of FIGS. 6 and 11.
FIG. 14 shows a variation of the valve states of FIGS. 7 and 12.

In FIG. 3, the chuck 2 is in an uppermost position relative to collector 4, which is a load/unload position at which a wafer W may be loaded onto or unloaded from the chuck 2. At this position, the state of valves 51-55 is the same as in FIG. 1. FIG. 9 is a corresponding view that more fully zation so as to minimize any pressure fluctuation within the collector 4. Moreover, in FIGS. 6 and 11, although valve 51 is shown in its chamber position, it may help to equalize the pressure within the collector 4 to position valve 51 at an intermediate position in which it admits into the pipe 31 downstream of valve 51 a predetermined ratio of ambient atmosphere and exhaust gas from the chamber 11, as illustrated in FIG. 13.

Figure 7:
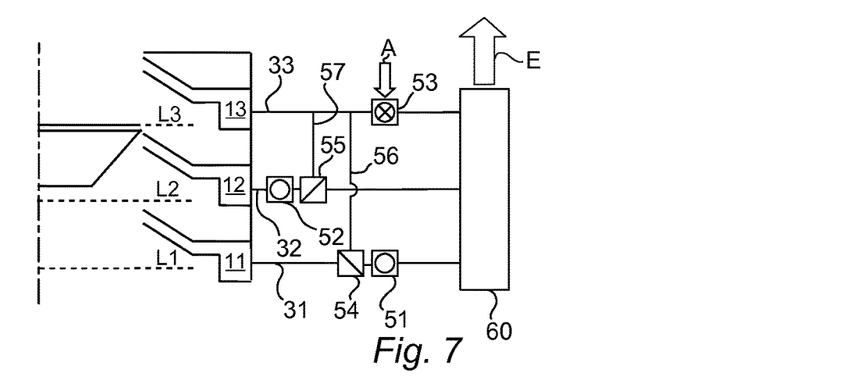
FIG. 7 shows a combination of valve states for a fifth wafer process.

In FIG. 7, the chuck 2 remains at the same position relative to the collector 4 such that the wafer W remains at the process level L3. However, a different process is performed in FIG. 7, which in this embodiment involves the use of carbon dioxide dissolved in deionized water (DI/$CO_2$). For such processing it is desirable to direct the exhaust to the exhaust pipe 32 that is designated for handling exhaust gases of an acidic character.

Figure 12:
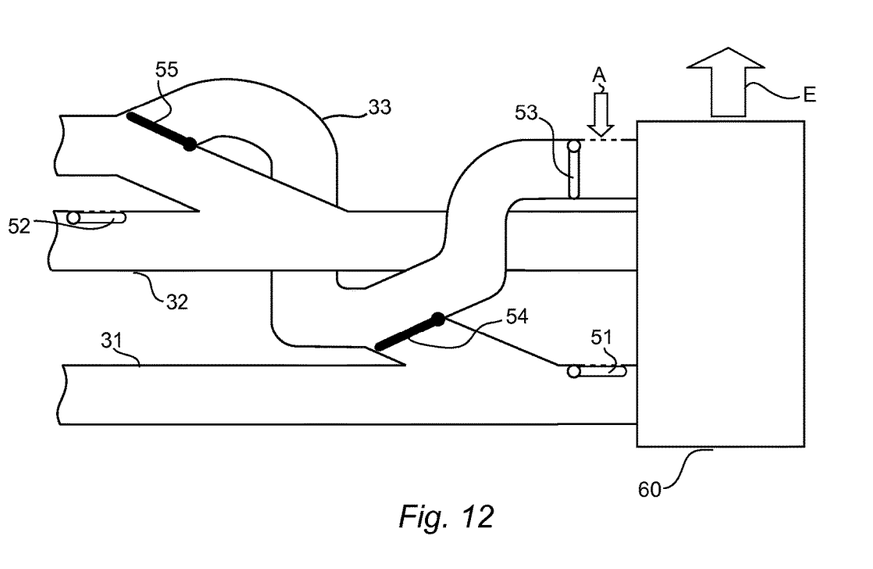
FIG. 12 shows in greater detail the valve states of FIG. 7.

As to the state of valves 51-55, it will be appreciated that, in changing from the level 3 processing of FIG. 6 to the level 3 processing of FIG. 7, the positions of bypass valves 54, 55 have been reversed, so that exhaust gas withdrawn from chamber 13 of collector 4 is now transferred from pipe 33 to pipe 32. FIG. 12 is a corresponding view that shows the valves and exhaust pipes more fully, and without additional bypass pipes.

In changing from the level 3 processing of FIGS. 6 and 11 to the level 3 processing of FIGS. 7 and 12, the valves 54, 55 are again actuated simultaneously and in synchronization so as to minimize any pressure fluctuation within the collector 4. Moreover, in FIGS. 7 and 12, although valve 52 is shown in its chamber position, it may help to equalize the pressure within the collector 4 to position valve 52 at an intermediate position in which it admits into the pipe 32 downstream of valve 52 a predetermined ratio of ambient atmosphere and exhaust gas from the chamber 12, as illustrated in FIG. 14.

Figure 8:
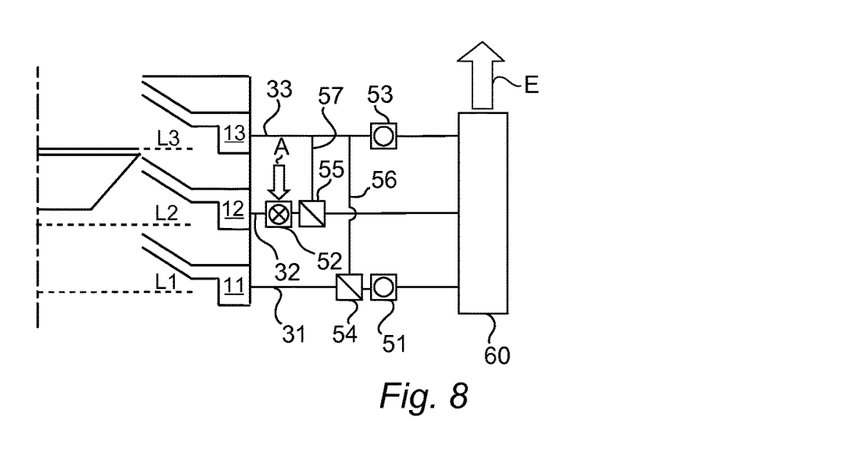
FIG. 8 shows a combination of valve states for a sixth wafer process.

In FIG. 8, the chuck 2 still remains at the same position relative to the collector 4 such that the wafer W remains at the process level L3. However, yet another different process is performed in FIG. 8, which in this embodiment involves the use of isopropyl alcohol (IPA) to rinse and dry the wafer W. For such processing it is desirable to direct the exhaust to the exhaust pipe 33 that is designated for handling exhaust gases of an organic character.

As to the state of valves 51-55, it will be appreciated that, in changing from the level 3 processing of FIG. 7 to the level 3 processing of FIG. 8, valves 51-55 are returned to the state shown in FIGS. 3, 4 and 9.

The exhaust system as thus described allows switching between chamber levels while keeping the pressure fluctuation as low as possible (+/−20 Pa). Furthermore, with the possibility to activate in the chamber two levels to the exhaust, it is possible to keep cross-contamination at less than 25 ppm even when using high temperature concentrated chemistries (for example: 60° C. 1:5 $NH_4OH$).

In the foregoing description a single exhaust unit 60 is shown, for ease of explanation. In practice, however, there is more preferably a separate exhaust provided for each type of chemical to be exhausted. Such different types of gases may be for example organics (e.g. organic solvents like IPA), oxidizing substances (e.g. ozone, hydrogen peroxide), acidic substances (e.g. HF or HCl) and basic substances (e.g. $NH_3$).

However, the device and method according to the present invention allow to selectively switch on/off specific process level exhausts without resulting in a significant change of exhaust volume flow. Consequently this allows a plurality of up to eight or more chambers to be simultaneously exhausted without any negative interaction due to unintended pressure drops.

Figure 15:
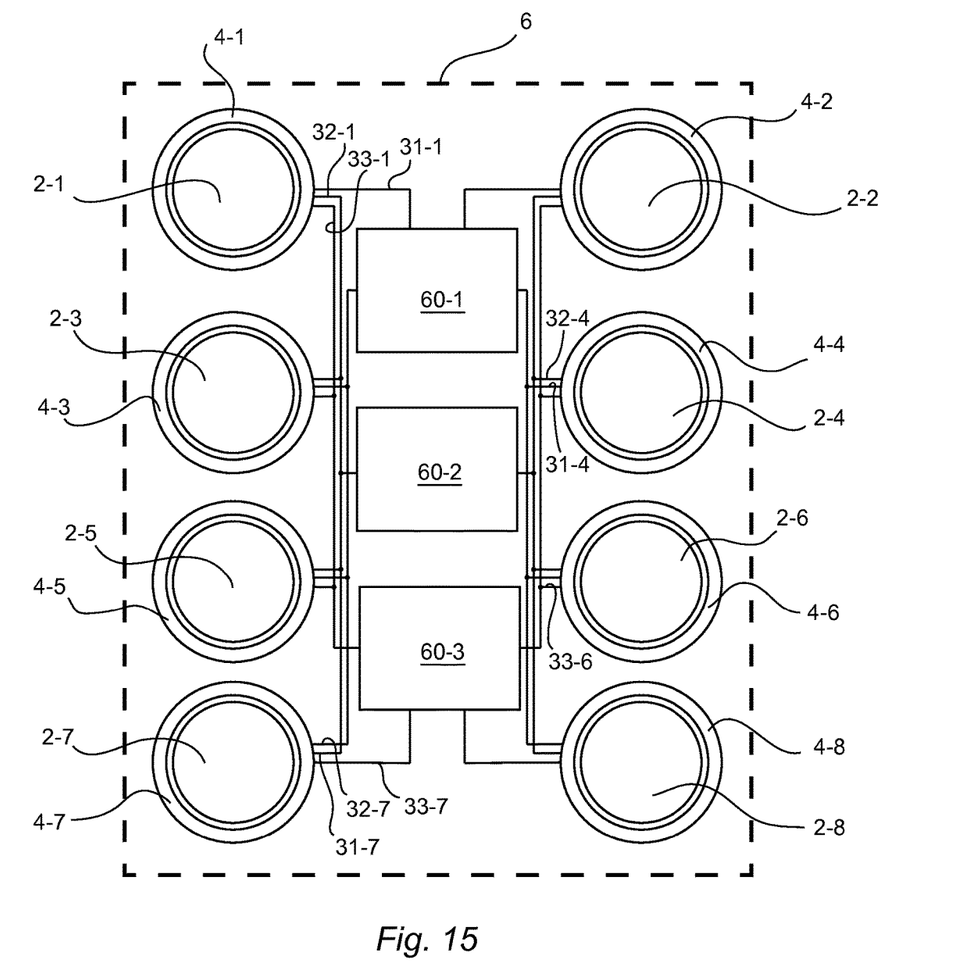
FIG. 15 is a schematic plan view of a process module that includes multiple devices according to the present invention, with exhaust units each of which is common to a given exhaust level of the multiple devices.

Thus, with reference to FIG. 15, a plurality of chucks 2-1 through 2-8, each with a corresponding collector 4-1 through 4-8, may be positioned within a same process module 6 for single wafer wet processing of semiconductor wafers. Each collector comprises an exhaust system with flap valves and bypass valves as described previously, in association with its associated exhaust conduits 31-1, 32-1, 33-1 through 31-8, 32-8, 33-8.

Gases exhausted through the conduits 31-1 through 31-8 may all be handled in a same exhaust unit 60-1, whereas gases exhausted through the conduits 32-1 through 32-8 may all be handled in a same exhaust unit 60-2, and gases exhausted through the conduits 33-1 through 33-8 may all be handled in a same exhaust unit 60-3. This more efficient design is made possible by the novel arrangement and operation of valves as described in detail above.

Although the invention has been described in connection with several preferred embodiments in the foregoing description, it will be appreciated by those skilled in the art that various modifications are possible without departing from the true scope and spirit of the invention as disclosed herein and as set forth in the appended claims.

What is claimed is:

1. Device for processing wafer-shaped articles, comprising:
   a spin chuck for holding and rotating a wafer-shaped article about a rotation axis;
   at least one dispenser for dispensing a liquid onto at least one surface of a wafer-shaped article; and
   a collector surrounding the spin chuck for collecting process liquids, with at least two collector levels for separately collecting liquids in different collector levels;
   wherein each of the at least two collector levels comprises an exhaust gas collecting chamber and an exhaust gas conduit;
   wherein at least one of the exhaust gas conduits comprises a valve mechanism to selectively (i) fluidly connect a chamber side of the at least one of the exhaust gas conduits to an exhaust unit side of the at least one of the exhaust gas conduits, and (ii) restrict the chamber side of the at least one of the exhaust gas conduits and fluidly connect an ambient environment to the exhaust unit side of the at least one of the exhaust gas conduits; and
   wherein one of the exhaust gas conduits comprises a bypass valve operable to route exhaust gas from the one of the exhaust pas conduits to another one of the exhaust gas conduits.

2. The device according to claim 1, wherein the valve mechanism comprises a flap valve movable between a chamber position in which exhaust gas from the chamber side is permitted to pass while the at least one of the exhaust gas conduits is sealed to the ambient environment, and an ambient position in which the ambient environment is permitted to pass while the at least one of the exhaust gas conduits is sealed to the chamber side.

3. The device according to claim 1, wherein the collector comprises at least three of the collector levels, and wherein the exhaust gas conduits of at least two of the collector levels each comprise a valve mechanism.

4. The device according to claim 3, wherein one of the exhaust gas conduits comprises a first bypass valve operable to route exhaust gas from the one of the exhaust gas conduits to a second one of the exhaust gas conduits, and a second bypass valve operable to route exhaust gas from the one of the exhaust gas conduits to a third one of the exhaust gas conduits.

5. The device according to claim 1, further comprising a controller to actuate the valve mechanism, and wherein the valve mechanism is actuated in response to the spin chuck being moved relative to the collector from one collector level to another collector level.

6. The device according to claim 1, wherein the collector levels are vertically superposed along an axis of rotation of the spin chuck.

7. The device according to claim 6, wherein the collector comprises three collector levels, and wherein the exhaust gas conduit of an uppermost collector level comprises a first bypass valve that is operable to divert exhaust gas from the exhaust gas conduit of the uppermost collector level to the exhaust gas conduit of a lowermost collector level, a second bypass valve that is operable to divert exhaust gas from the exhaust gas conduit to the exhaust gas conduit of a middle collector level, and a valve mechanism disposed in the exhaust gas conduit of the uppermost collector level downstream of the first and second bypass valves.

8. The device according to claim 1, wherein the collector comprises three collector levels, and wherein each of the exhaust gas conduits of the three collector levels comprises a valve mechanism.

9. The device according to claim 1, wherein the valve mechanism is operable such that actuation of the valve mechanism causes a pressure variation of less than 20 Pa in any others of the at least two collector levels.

10. The device according to claim 1, wherein the at least one of the exhaust gas conduits further comprises a bypass valve disposed upstream of the valve mechanism, the bypass valve being operable to route exhaust gas from the at least one of the exhaust gas conduits to another one of the exhaust gas conduits.

11. The device according to claim 10, wherein the valve mechanism and the bypass valve are operated by a controller such that the bypass valve is actuated to divert exhaust gas from the at least one of the exhaust gas conduits to the another one of the exhaust gas conduits in response to actuation of the valve mechanism to seal the at least one of the exhaust gas conduits against passage of chamber exhaust while opening the at least one of the exhaust gas conduits to the ambient environment at a location downstream of the bypass valve.

12. Device for processing wafer-shaped articles, comprising:
 a spin chuck for holding and rotating a wafer-shaped article about a rotation axis;
 at least one dispenser for dispensing a liquid onto at least one surface of a wafer-shaped article;
 a collector surrounding the spin chuck for collecting process liquids, with three collector levels for separately collecting liquids in different collector levels;
 wherein each of the three collector levels comprises an exhaust gas collecting chamber leading to a respective exhaust gas conduit;
 wherein at least one of the exhaust gas conduits comprises a valve mechanism that reciprocally restricts exhaust gas flow from its associated exhaust gas conduit while opening the exhaust gas conduit to an ambient environment outside the collector, and vice-versa;
 wherein the three collector levels are vertically superposed along an axis of rotation of the spin chuck; and
 wherein an exhaust gas conduit of an uppermost collector level comprises a first bypass valve that is operable to divert exhaust gas from the exhaust gas conduit to an exhaust gas conduit of a lowermost collector level, a second bypass valve that is operable to divert exhaust gas from the exhaust gas conduit to an exhaust gas conduit of a middle collector level, and a the valve mechanism disposed in the exhaust gas conduit of the uppermost collector level downstream of the first and second bypass valves.

13. Device for processing wafer-shaped articles, comprising:
 a spin chuck for holding and rotating a wafer-shaped article about a rotation axis;
 at least one dispenser for dispensing a liquid onto at least one surface of a wafer-shaped article; and
 a collector surrounding the spin chuck for collecting process liquids, with at least two collector levels for separately collecting liquids in different collector levels,
 wherein each of the at least two collector levels comprises an exhaust gas collecting chamber and an exhaust gas conduit, and
 wherein at least one of the exhaust gas conduits comprises a valve mechanism that reciprocally restricts exhaust gas flow from its associated exhaust gas conduit while opening the exhaust gas conduit to an ambient environment outside the collector; and wherein one of the exhaust gas conduits comprises a bypass valve operable to route exhaust gas from the one of the exhaust gas conduits to another one of the exhaust gas conduits.

* * * * *